United States Patent [19]

Garling et al.

[11] Patent Number: 5,175,117

[45] Date of Patent: Dec. 29, 1992

[54] METHOD FOR MAKING BURIED ISOLATION

[75] Inventors: Lisa K. Garling, Mesa; Robert H. Reuss, Scottsdale; Ping Wang, Chandler, all of Ariz.

[73] Assignee: Motorola, Inc., Schaumburg, Ill.

[21] Appl. No.: 812,499

[22] Filed: Dec. 23, 1991

[51] Int. Cl.⁵ .................. H01L 21/265; H01L 29/70; H01L 21/70

[52] U.S. Cl. ........................ 437/31; 437/59; 437/75; 437/156

[58] Field of Search ............... 437/75, 63, 950, 156, 437/74, 59, 31; 148/34, 144

[56] References Cited

U.S. PATENT DOCUMENTS

| | | | |
|---|---|---|---|
| 3,667,006 | 5/1972 | Ruegg | 437/75 |
| 3,713,908 | 1/1973 | Agasta et al. | 437/75 |
| 3,891,480 | 6/1975 | Fulkerson | 437/75 |
| 4,260,999 | 4/1981 | Yoshioka | 437/75 |
| 4,357,622 | 11/1982 | Magdo et al. | 437/63 |
| 4,377,029 | 3/1983 | Ozdwa | 437/75 |

FOREIGN PATENT DOCUMENTS 0016186  2/1987  Japan ................................. 437/75

Primary Examiner—Olik Chaudhuri
Assistant Examiner—Long Pham
Attorney, Agent, or Firm—Joe E. Barbee

[57] ABSTRACT

A method for making bipolar transistors with a first and a second buried collectors that are separated wherein the first and second buried collectors are separated by a p buried layer that is made by depositing a heavily doped boron layer and subsequently diffusing boron from the boron layer into the area between the first and second buried collector.

10 Claims, 2 Drawing Sheets

METHOD FOR MAKING BURIED ISOLATION

BACKGROUND OF THE INVENTION

This invention relates, in general, to semiconductor products, and more particularly, to making semiconductor devices.

At the present time, separation and isolation of n+buried layers or n+ buried collectors in a substrate is achieved by placing a p buried isolation layer between the n+ buried layers or n+ buried collectors. It should be understood that hereinafter references made to n+buried collector will include n+ buried layers. Conventionally, the p buried layer is made by a multi-step process, using photolithography and ion implantation. Typically, the photolithography is achieved with well-known conventional methods which expose or open areas between the buried layers, while other areas are covered or protected by a photoresist layer. The exposed or open areas are then implanted with a suitable p dopant, thereby producing a p region between the n+buried collectors. Upon subsequent processing the p region is diffused and activated to form a p buried layer between the n+ buried collectors that is more heavily doped than the substrate.

However, as semiconductor devices continue to shrink, while at the same time increasing in complexity, isolation or separation problems between n+ buried collectors become more apparent and affect the semiconductor devices that are made with the conventional methods. The conventional methods of isolation or separation of n+ buried collectors result in several problems, such as punchthrough problems between the two n+ buried collectors, capacitance problems between the n+ buried collectors and the p buried layers, and additional processing to make the p buried layer. Ultimately, these problems result in poor performance of the semiconductor device as well as yield failures.

It can be readily seen that conventional methods of placing isolation or separation areas between the buried layers or buried collectors is not sufficient for semiconductor devices that require higher performance and have reduced size. Additionally, because of the decreasing size of the semiconductor devices and the increasing complexity of the semiconductor devices, problems with isolation and separation of buried layers or buried collectors will increase. Therefore, a method for making a bipolar semiconductor device that allows for reduction of parasitic capacitance while avoiding punchthrough, and reduction of the number of processing steps for making the p buried isolation layer would be highly desirable.

SUMMARY OF THE INVENTION

Briefly stated, according to the present invention, a method is provided for making bipolar transistors with a first and a second buried collectors separated by an area, wherein a p buried layer is made by diffusing boron from a boron layer into the area between the first and second buried collectors. The boron layer is a heavily doped layer that covers at least the area between the first and second buried collectors.

DETAILED DESCRIPTION OF THE DRAWINGS

Figure 1:
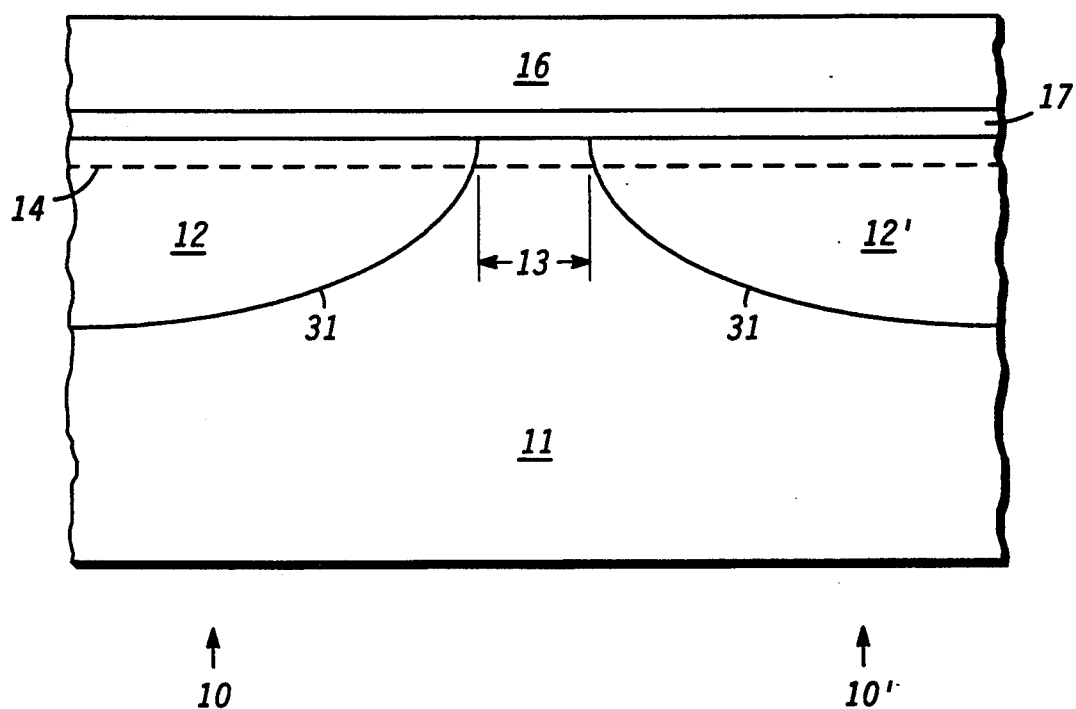
FIG. 1 illustrates a greatly simplified pictorial cross-sectional view of two partially made bipolar transistors.

FIG. 1 illustrates a greatly simplified pictorial cross-sectional view of two partially made bipolar transistors 10 and 10'. It should be understood that FIG. 1 illustrates only a portion of a semiconductor substrate 11 and that there can be many more partially made bipolar transistors present than are shown. Conventionally, a semiconductor substrate 11 is provided, which is p-type. N+ buried layers 12 and 12' are made using well-known conventional photolithography methods and ion implantation methods. Typically, a thin oxide (not shown) is grown over semiconductor substrate 11. A photoresist layer (not shown) is applied over the thin oxide, exposed, and developed, thereby creating islands of photoresist and exposed areas of thin oxide. Semiconductor substrate 11 subsequently is implanted through the thin oxide with ions, such as Arsenic (As) or Antimony (Sb), thereby creating regions of n+ dopant in semiconductor substrate 11, while the islands of photoresist prevent the dopant region or from reaching silicon substrate 11 and create a reduced dopant space 13 between buried collectors 12 and 12'. It should be understood that buried collectors 12 and 12' are made of a different conductivity than semiconductor substrate 11, thereby creating a p/n junction or sidewall 31. As practiced in the prior art, a p dopant buried isolation layer is made between buried collectors 12 and 12'. Typically, the p buried isolation layer is made by another series of photolithography processes and ion implantation processes, thereby inducing many more defects through unnecessary processing steps. Additionally, it should be understood, that other processes such as oxidation, temperature treatment, and the like are commonly used to make semiconductor transistors or semiconductor devices in semiconductor substrate 11. Also, as semiconductor devices and geometries continue to shrink, space 13 continues to shrink as well, thus making placement or alignment of the exposed areas for ion implantation of the p isolation buried layer difficult to achieve.

In the present invention, a highly doped p layer 17 of silicon is epitaxially grown over semiconductor substrate 11, thus covering both n+ buried collectors 12 and 12', as well as region or space 13. By placing highly doped p layer 17 directly over region or space 13, dopant from highly doped p layer 17 diffuses into region or space 13 in perfect alignment during subsequent processing without additional photolithography or ion implantation processing steps. This process is commonly known as a self-aligning or an, auto-aligning process. Also, elimination of the additional processing steps substantially reduces processing defects while achieving self-alignment advantages of placing dopant exactly between buried collector 12 and 12'. During the subsequent processing steps the dopant from highly doped p layer 17 diffuses into region or space 13, thereby creating a shallow dopant isolation that is more heavily doped than the semiconductor substrate 11 between buried collectors 12 and 12' thus creating a dopant barrier between buried collectors 12 and 12'. Additionally, dopant from layer 17 diffuses into both buried layers 12 and 12'; however, the diffusion of p dopant from layer 17 does not significantly affect electrical characteristics of buried collectors 12 and 12'.

Figure 2:
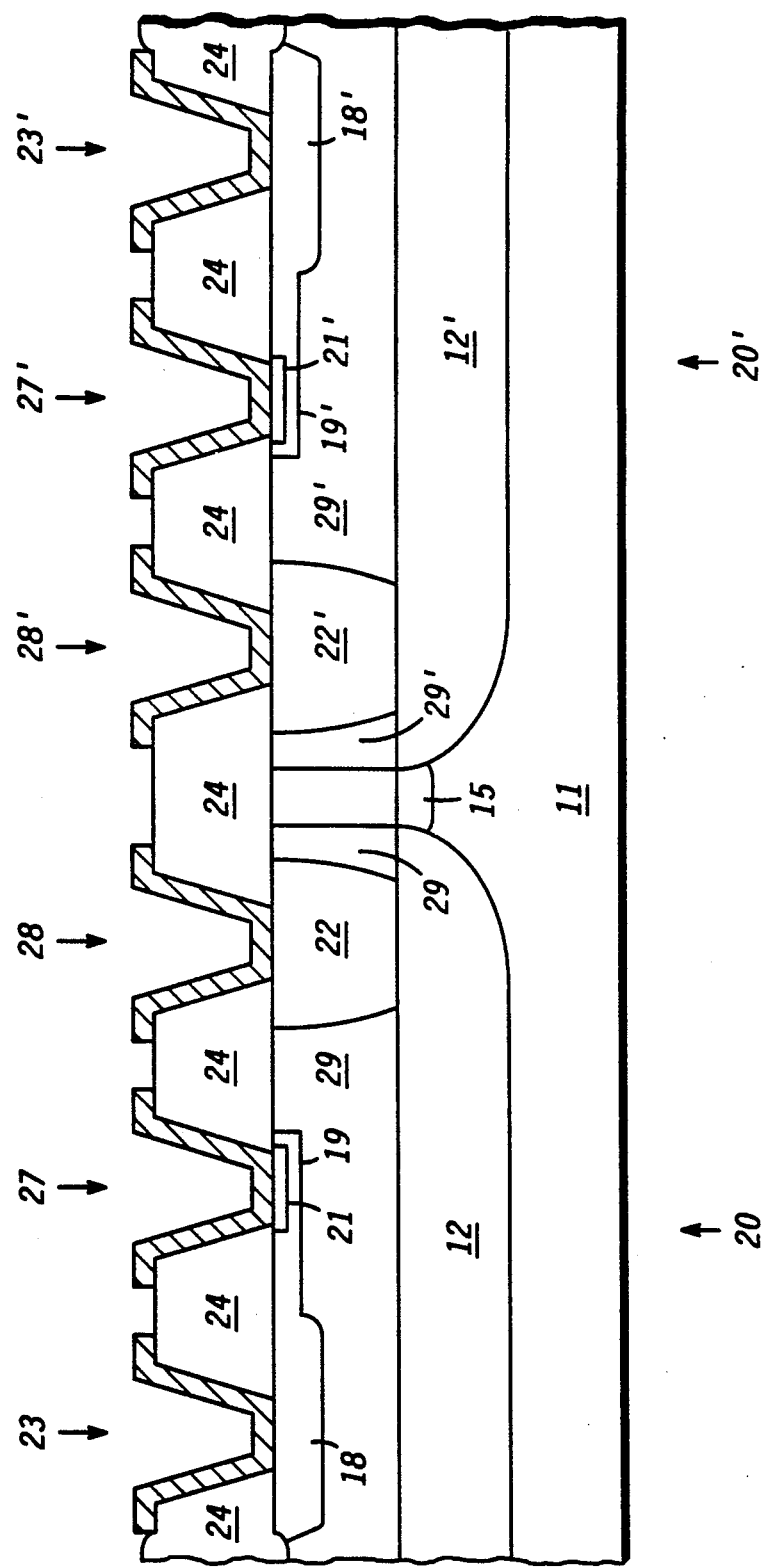
FIG. 2 illustrates a simplified pictorial cross-section of two bipolar transistors with a heavily doped region located between two buried layers in the substrate.

Diffusion of dopant from layer 17 into substrate 11 is schematically illustrated by dotted line 14 and is intended for illustrative purposes only. Additionally, an epitaxially deposited layer 16 of lightly doped p silicon is subsequently grown over heavily doped layer 17 in preparation for making n-wells 29 and 29' as shown in FIG. 2.

By way of example, layer 17 is made of an epitaxially deposited silicon layer, which is heavily doped with boron. Concentration of boron in layer 17 is adjusted to an approximate range of between 1.0e16 atoms/cm$^3$ to 1.0e18 atoms/cm$^3$; however, in a preferred embodiment the concentration of boron is 1.0e17 atoms/cm$^3$. Thickness of heavily doped p silicon layer 17 is adjusted to range between 0.1 micron to 0.4 micron, with the thickness, in a preferred embodiment, being 0.2 micron.

Typically, growth conditions used to achieve the above described thickness and dopant values for layer 17 are with a reactor temperature adjusted to range from 700 degrees Celsius to 1,300 degrees Celsius, and preferably with the temperature adjusted to 1050 degrees Celsius; reactor pressure adjusted to range from 10 torr to 760 torr, and preferably with the pressure adjusted to 80 torr; reactor gas flow for hydrogen ($H_2$) adjusted to range from 10.0 standard liters per minute to 300.0 standard liters per minute, and preferably with the flow for $H_2$ adjusted to 240.0 standard liters per minute; reactor gas flow for dichlorosilane ($SiH_2Cl_2$) adjusted to range from 100.0 standard cubic centimeters per minute to 3,000.0 standard cubic centimeters per minute, and reactor gas flow for diborane ($B_2H_6$) adjusted to range from 80.0 standard cubic centimeters per minute to 400.0 standard cubic centimeters per minute, and preferably with gas flows adjusted substantially to 800.0 standard cubic centimeters per minute and 250.0 standard cubic centimeters per minute, respectively. It should be understood that specific temperatures, pressures, gas flows, and selection of gases will vary greatly depending upon each specific reactor and gas sources.

Once layer 17 has completed growing in the epitaxy reactor, lightly doped p layer 16 is immediately grown in the same reactor, thus further reducing defects and reducing process complexity. Layer 16 is a lightly doped epitaxially deposited silicon. Doping of layer 16 is accomplished with boron with a concentration of 5.0e15 atoms/cm$^3$ or below. Thickness of layer 16 ranges from 1.0 to 3.0 microns, with the thickness, in a preferred embodiment, being 1.4 microns. In a preferred embodiment, the dopant level is 1.0e15 atoms/cm$^3$.

Typically, growth conditions used for growing layer 16 are with a reactor temperature adjusted to range from 700 degrees Celsius to 1,300 degrees Celsius, and preferably with the temperature adjusted to 1030 degrees Celsius; reactor pressure adjusted to range from 10 torr to 760 torr, and preferably with the pressure adjusted to 200 torr, reactor gas flow for hydrogen ($H_2$) adjusted to range from 10.0 standard liters per minute to 300.0 standard liters per minute, and preferably with the flow for $H_2$ adjusted to 240.0 standard liters per minute; reactor gas flow for dichlorosilane ($SiH_2Cl_2$) adjusted to range from 100.0 standard cubic centimeters per minute to 3.000.0 standard cubic centimeters per minute, and preferably with the $SiH_2Cl_2$ adjusted to 800.0 standard cubic centimeters per minute; and reactor gas flow for diborane ($B_2H_6$) adjusted to range from 20.0 standard cubic centimeters per minute to 300.0 standard cubic centimeters per minute, and preferably with the gas flow for $B_2H_6$ adjusted to 60.0 standard cubic centimeters per minute. It should be understood that specific temperatures, pressures, gas flows, and selection of gases will vary greatly depending upon each specific reactor and gas sources.

Typically, dopant from layer 17 is diffused into substrate 11 by thermal processing. Further, depth of the diffused dopant is spread into substrate 11 with a range between a top surface of substrate 11 to a depth of 1.0 micron; however, it is preferable to adjust the dopant diffusion to a depth of approximately 0.5 micron or less. However, it should be understood that diffusion of the dopant into substrate 11 is a function of thermal processing thus a longer processing time and a higher temperature results in greater depth of diffusion. In a preferred embodiment, a majority of diffusion of layer 17 occurs during subsequent processing in which several dopants are diffused at once, such as dopant for n regions 29 and 29' shown in FIG. 2, However, it should be understood by those knowledgeable in the art, that the dopant diffusion is further adjusted by additional thermal processes that occur during normal processing. Also, it should be further understood that diffusion of dopant from layer 17 into substrate 11 is capable of being achieved during a single thermal processing step.

FIG. 2 illustrates a simplified pictorial cross-section of two bipolar transistors 20 and 20', with a doped region 15 located between buried collectors 12 and 12'.

Bipolar transistors 20 and 20' are made by using an embodiment of the present invention. Generally, a p-type silicon substrate 11 is selected, and buried collectors 12 and 12'.

Additionally, a plurality of structures are made in layer 16 by well-known photolithography and ion implantation methods, such as a plurality of n regions 29 and 29', a plurality of intrinsic bases 18 and 18', a plurality of extrinsic bases 19 and 19', a plurality of emitters 21 and 21', and a plurality of deep buried collector contacts 22 and 22'. Once the structures are made, conventional methods are generally used to make typical insulation features, such as dielectric layer 24, connections, such as collector contacts 28 and 28', base contacts 23 and 23', and emitter contacts 27 and 27', that are required. However, making bipolar transistors 20 and 20' with conventional methods of forming a p buried layer between buried collector 12 and 12' results in several problems, such as performance problems, punchthrough problems, and a complicated photolithography implantation process.

In the present invention, however, performance problems are resolved and punchthrough problems are avoided by using a process that is simpler, self-aligned, as well as without adding additional manufacturing steps thereby not increasing cost.

Performance is enhanced because parasitic capacitance is reduced. More specifically, sidewall capacitance between substrate 11 and buried collector 12 and 12' is greatly reduced by using the present invention. In the present invention, p buried layer 15 is able to be made substantially more shallow than with conventional techniques, thus reducing the relative total capacitance between p buried layer 15 and n+ buried collector 12 and 12'. It is well known that reduction of capacitance in semiconductor devices results in additional performance, such as speed and power of the semiconductor device.

Punchthrough in a semiconductor device is defined as current leakage between two doped regions, such as buried layer 12 and 12'. This leakage or punchthrough renders the semiconductor device nonfunctional. However, use of the present invention increases a voltage that is required to cause punchthrough or leakage between buried layers 12 and 12'. This increased voltage required to cause punchthrough is due to placement of p buried isolation layer 15 in substrate 11 which during subsequent thermal processing creates a self-aligned shallow doped p buried isolation layer 15 between buried collectors 12 and 12', thus reducing punchthrough. It should be understood that by increasing the voltage required to punchthrough, that a low voltage punchthrough is eliminated. Also, use of the present invention results in shallow doped p buried isolation layer 15, which is placed specifically where most punchthrough occurs.

By now it should be appreciated that a method for making a bipolar transistor has been provided that reduces parasitic capacitance between n+ buried collector 12 and 12' and p buried layer 15. Additionally, a method has been provided that is greatly simplified and allows p buried isolation layer 15 to be more precisely located between buried collectors 12 and 12'. Also, the method can be easily and inexpensively implemented in an already existing process.

We claim:

1. A method for reducing punchthrough comprising:
providing a p-type semiconductor substrate;
providing a first buried collector region with a first junction and a second buried collector with a second junction, wherein the first and second junctions in the semiconductor substrate are positioned with a small region of the p-type semiconductor substrate between the first and second buried collectors;
depositing a heavily doped layer of silicon on the semiconductor substrate, covering the region and the first and second buried collectors;
depositing a lightly doped layer of epitaxial silicon over the heavily doped layer of epitaxial silicon; and
completing subsequent thermal fabrication sequences for making at least a bipolar transistor which diffuses at least a portion of the dopant of the heavily doped layer into the region between the first and second buried collectors and into the first and second buried collector during subsequent thermal processing making a doped isolation barrier between the first buried collector and the second buried collector, thereby positioning a more heavily doped dopant barrier between the first and second buried collector thus reducing punchthrough.

2. The method of claim 1 wherein the depositing of the heavily doped layer is accomplished with boron doped layer at a concentration range from 1.0e16 atoms/cm$^3$ to 1.0e18 atoms/cm$^3$, and a thickness range from 0.1 micron to 0.4 micron.

3. The method of claim 2 wherein the boron doped layer concentration range and thickness range are substantially adjusted to 1.0e17 atom/cm$^3$ and 0.2 micron, respectively.

4. A method for making bipolar transistors with a first and a second buried collector that are separated, wherein the first and second buried collectors are spaced apart by a p buried layer that is made by depositing a heavily doped boron layer onto the first and second buried collectors, as well as a space apart between the first and second buried collectors and subsequently diffusing boron from the doped boron layer into the space apart by growing a subsequent epi layer and by subsequent processing steps on the epi layer, thereby creating the p buried layer.

5. The method of claim 4 wherein the depositing of the heavily doped layer is accomplished with a boron doped layer with a concentration range from 1.0e16 atom/cm$^3$ to 1.0e18 atoms/cm$^3$, and a thickness range from 0.1 micron to 0.4 micron.

6. The method of claim 4 wherein the boron doped layer concentration range and thickness range are substantially adjusted to 1.0e17 atoms/cm$^3$ and 0.2 micron respectively.

7. A method for reducing relative capacitance for a bipolar transistor comprising:
providing a p-type semiconductor substrate;
providing a first n+ buried collector and a second n+ buried collector, wherein the first n+ buried collector and the second n+ buried collector are positioned in the p-type semiconductor substrate, with a small region positioned in the p-type substrate between the first n+ buried collector and the second n+ buried collector;
depositing a heavily doped p-type epitaxial layer covering at least the region between the first and second n+ buried collectors; and
having at least a portion of the dopant from the heavily doped epitaxial layer move into at least the region between the first and second n+ buried collectors during subsequent thermal processing, thereby reducing capacitance between the first and second n+ buried collectors and the p-type substrate.

8. The method of claim 7 further comprising depositing a lightly doped epitaxial layer on the heavily doped p-type layer.

9. The method of claim 8 wherein the depositing of the lightly doped layer is accomplished with boron doped layer at a concentration less than 5.0e15 atoms/cm$^3$, and a thickness range from 1.0 micron to 3.0 microns.

10. The method of claim 9 wherein the lightly doped layer is substantially adjusted to 1.0e15 atoms/cm$^3$ and the thickness is substantially adjusted to 1.4 microns.

* * * * *